United States Patent
Takabayashi et al.

(10) Patent No.: US 7,130,322 B2
(45) Date of Patent: Oct. 31, 2006

(54) WAVELENGTH TUNABLE LASER AND METHOD OF CONTROLLING THE SAME

(75) Inventors: Kazumasa Takabayashi, Kawasaki (JP); Ken Morito, Kawasaki (JP); Yuji Kotaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 282 days.

(21) Appl. No.: 10/810,601

(22) Filed: Mar. 29, 2004

(65) Prior Publication Data

US 2005/0094680 A1    May 5, 2005

(30) Foreign Application Priority Data

Oct. 30, 2003    (JP)    ............... 2003-370805

(51) Int. Cl.
- H01S 3/13    (2006.01)
- H01S 3/10    (2006.01)
- H01S 3/00    (2006.01)

(52) U.S. Cl. ............ 372/29.016; 372/9; 372/20; 372/29.02; 372/33; 372/38; 372/29.011; 372/32

(58) Field of Classification Search ............ 372/20, 372/29.011, 29.016, 38.01, 9, 33, 29.02, 32
See application file for complete search history.

(56) References Cited

U.S. PATENT DOCUMENTS

| | | | |
|---|---|---|---|
| 4,622,672 A | | 11/1986 | Coldren et al. |
| 4,881,231 A | * | 11/1989 | Jain ............ 372/32 |
| 4,947,398 A | * | 8/1990 | Yasuda et al. ......... 372/29.021 |
| 5,798,859 A | * | 8/1998 | Colbourne et al. ......... 359/247 |
| 5,949,801 A | * | 9/1999 | Tayebati ............ 372/20 |
| 6,498,800 B1 | * | 12/2002 | Watterson et al. ............ 372/20 |
| 6,560,252 B1 | * | 5/2003 | Colbourne et al. ............ 372/32 |
| 6,587,485 B1 | * | 7/2003 | Renlund et al. ............ 372/20 |
| 6,665,321 B1 | * | 12/2003 | Sochava et al. ............ 372/20 |
| 6,735,226 B1 | * | 5/2004 | Shikatani ............ 372/26 |
| 6,788,717 B1 | * | 9/2004 | Yokoyama ............ 372/29.01 |
| 6,859,284 B1 | * | 2/2005 | Rella et al. ............ 356/519 |
| 2003/0142700 A1 | | 7/2003 | Pontis et al. |
| 2004/0091001 A1 | * | 5/2004 | Sochava et al. ............ 372/20 |
| 2004/0213303 A1 | * | 10/2004 | Litvin ............ 372/28 |

(Continued)

FOREIGN PATENT DOCUMENTS

JP    401160072 A  *  6/1989    ........ 372/FOR. 100

(Continued)

OTHER PUBLICATIONS

Patent Abstracts of Japan, No. 7-335965, published Dec. 22, 1995.

(Continued)

*Primary Examiner*—Minsun Oh Harvey
*Assistant Examiner*—Hrayr A. Sayadian
(74) *Attorney, Agent, or Firm*—Armstrong, Kratz, Quintos, Hanson & Brooks, LLP

(57) ABSTRACT

There is provided a phase control portion for controlling phase of a laser beam resonated in a resonator based on detected results by two optical detectors. The phase control portion adjusts the longitudinal mode positions by a feedback control so that a ratio of intensities detected by the two optical detectors comes to a predetermined reference value. To one of the optical detectors, part of a laser beam outputted from the resonator is irradiated as it is, whereas, to the other one of the optical detectors, part of the laser beam outputted from the resonator is irradiated after passing through an etalon. An FSR of the etalon is a double of that of another etalon in the resonator.

17 Claims, 10 Drawing Sheets

U.S. PATENT DOCUMENTS

2005/0265402 A1* 12/2005 Tanaka et al. ................. 372/20
2006/0002436 A1* 1/2006 Takabayashi et al. ......... 372/20

FOREIGN PATENT DOCUMENTS

JP         02002185074 A    *   6/2002          372/FOR. 100

OTHER PUBLICATIONS

Patent Abstracts of Japan, No. 2001-85774, published Mar. 30, 2001./Discussed in the specification.

Patent Abstracts of Japan, No. 2001-251013, published Sep. 14, 2001./Discussed in the specification.

Patent Abstracts of Japan, No. 2002-185074, published Jun. 28, 2002./Discussed in the specification.

A. Sharon, et al.; "Resonant grating-waveguide structures for visible and near-infrared radiation"; *Journal of the Optical Society of America A*; vol. 14; No. 11; Nov. 1997; pp. 2985-2993./Discussed in the specification.

\* cited by examiner

OPTICAL FREQUENCY

OPTICAL FREQUENCY

OPTICAL FREQUENCY

WAVELENGTH TUNABLE LASER AND METHOD OF CONTROLLING THE SAME

CROSS-REFERENCE TO RELATED APPLICATIONS

This application is based upon and claims the benefit of priority from the prior Japanese Patent Application No. 2003-370805, filed on Oct. 30, 2003, the entire contents of which are incorporated herein by reference.

BACKGROUND OF THE INVENTION

1. Field of the Invention

The present invention relates to a wavelength tunable laser suitable for multi-wavelength communication systems and so forth and a method of controlling the same.

2. Description of the Related Art

Along with dramatic increase in demands for communication in recent years, development of multi-wavelength communication systems (wavelength-division multiplexing (WDM) systems), which realize high-capacity transmission by a single optical fiber by way of multiplexing plural signal beams of different wavelengths, shows progress. For such multi-wavelength communication systems, a wavelength tunable laser capable of selecting a desired wavelength from a wide range of wavelengths is strongly expected in building the systems.

As a structure for realizing the wavelength tunable laser capable of selecting the desired wavelength from a wide range of wave lengths, as shown in FIG. 7, there is one having a resonator provided with two reflectors 106, 107, in which there are arranged a semiconductor optical amplifier (SOA) 101 having gain for a wide range of wavelengths, a phase shifter 102, a wavelength tunable filter 103 capable of selecting the desired wavelength from a wide range of wavelengths, and an etalon 105. An etalon is an optical filter having a periodical transmissive wavelength. In addition, outside the resonator, there are provided a beam splitter 109 for splitting part of a laser beam passing through the reflector 107, an optical detector 110 for detecting an optical intensity of the laser beam split by the beam splitter 109, and a phase control portion 111 for controlling phase condition, in other words the longitudinal-mode position, based on detection results by the optical detector 110.

In the wavelength tunable laser of such a structure, in order to control an oscillation wavelength, two types of controls described below are required. A first control is a coarse control to adjust the wavelength selected by the wavelength tunable filter 103 to a desired transmissive wavelength of the etalon 105. A second control is a fine control to adjust the oscillation wavelength to a desired wavelength (for example, the ITU grid.) by adjusting a longitudinal-mode position of the resonator. For the second control, there is provided inside the resonator the phase shifter 102 for controlling resonator length (phase), allowing the control of the longitudinal-mode position of the resonator.

For controlling phase, there are such techniques that integrate an optical waveguide for phase control with the SOA and change the resonator length by making use of the change in the refractive index of waveguide caused by current injection by disposing a semiconductor, as described in Patent document 1, or that change position of a mirror composing the resonator.

When controlling such a phase, conventional wavelength tunable lasers detect an intensity of a laser beam and perform feedback so that the intensity is maximized, as described in Patent document 2, or perform feedback so that a voltage applied to an active layer of the SOA is minimized, as described in Patent document 3. These phase controls are making use of such characteristics that the intensity of the laser beam is maximized and the voltage of the active layer of the SOA is minimized when the longitudinal-mode position of the resonator coincides with the transmissive peak wavelength of the etalon channel selected by the wavelength tunable filter.

However, such controls as maximizing the intensity of the laser beam or performing feedback to minimize the voltage of the SOA active layer have problems as described below.

First, because of the influence of asymmetric gain saturation in the SOA, the phase in which the laser beam intensity is maximized and the voltage of the SOA active layer is minimized deviates from a point enabling the most stabilized control. FIG. 8 is a view showing a change in optical output (laser beam intensity) when phase is changed. As shown in FIG. 8, the change in optical output with regard to phase (longitudinal-mode position) is periodical. Each range in which optical output is continuously changing corresponds to a range in which the oscillation of a longitudinal mode is performed, and the oscillation shifts to the other longitudinal mode at a point of a discontinuously changing phase. The change in optical output in the range in which oscillation is performed in a single longitudinal mode is asymmetric to the phase where optical output is maximized, and when the phase deviates from the phase to maximize the optical output toward the short wave side, the oscillation is immediately performed using the other longitudinal mode. Such a phenomenon occurs under the influence of the asymmetric gain saturation in the SOA, in which the gain in the oscillation wavelength on the short wave side falls and the same on a long wave side increases to thereby facilitate oscillation in a mode of the long wave side. This is unavoidable at this moment.

Therefore, in the technique which performs feedback to maximize optical output, the tolerance of phase position on the short wave side is smaller, so that a mode jump tends to occur. As a result, stable oscillation becomes difficult to thereby worsen noise characteristics of the laser. Such a phenomenon similarly occurs when monitoring the voltage of the active layer. Besides, a laser beam intensity change caused by other factor, for example deviation of the filter wavelength of the wavelength tunable filter, may affect sometimes.

Secondly, when the above-mentioned control is performed, it is required to control by a dithering with regard to the phase so that the change in laser beam intensity (optical output) or the slope of voltage change in the active layer comes to 0 (zero). However, the dithering with regard to the phase leads to a periodical change of the longitudinal position, whereby the oscillation wavelength varies.

Prior Arts are disclosed in Patent document 1 (Japanese Patent Application Laid-Open No. Hei 7-335965), Patent document 2 (U.S. Patent Application Publication No. 2003/0142700A1), Patent document 3 (U.S. Pat. Ser. No. 4,622, 672), Patent document 4 (Japanese Patent Application Laid-Open No. 2001-85774), Patent document 5 (Japanese Patent Application Laid-Open No. 2001-251013), Patent document 6 (Japanese Patent Application Laid-Open No. 2002-185074), and Non-Patent document 1 (Sharon et al. in Journal of the Optical Society of America A, vol. 14, No. 11, pp. 2985–2993 (1997)).

SUMMARY OF THE INVENTION

An object of the present invention is to provide a wavelength tunable laser capable of controlling an oscillation wavelength easily and appropriately, and a method of controlling the same.

After due diligent efforts to bring a solution to the above-mentioned technical problems, the present inventors have devised some embodiments as will be described hereinbelow.

The wavelength tunable laser according to the present invention is provided with a semiconductor optical amplifier for emitting a laser beam, a wavelength tunable filter arranged in an optical path of the laser beam, a first optical filter arranged in the optical path of the laser beam and provided with a periodical transmissive wavelength, two reflective members arranged so as to hold the semiconductor optical amplifier, the wavelength tunable filter, and the first optical filter, therebetween, the two reflective members being for resonating the laser beam, and a phase shifter for controlling a phase of the laser beam resonating between the reflective members. The wavelength tunable laser is further provided with a first unit to split light and a second unit to split light for splitting part of the laser beam passing through one of the reflective members, a first optical detector for detecting an intensity of the laser beam split by the first unit to split light, a second optical filter arranged in the optical path of the laser beam split by the second unit to split light and provided with a periodical transmissive wavelength, and a second optical detector for detecting the intensity of the laser beam passing through the second optical filter. The phase shifter controls phase of the laser beam so that a ratio of the intensity detected by the second optical detector to the intensity detected by the first optical detector comes to a certain value.

DETAILED DESCRIPTION OF THE PREFERRED EMBODIMENTS

Hereinafter, a wavelength tunable laser according to embodiments of the present invention and a method of controlling the same will be described.

First Embodiment

Figure 1:
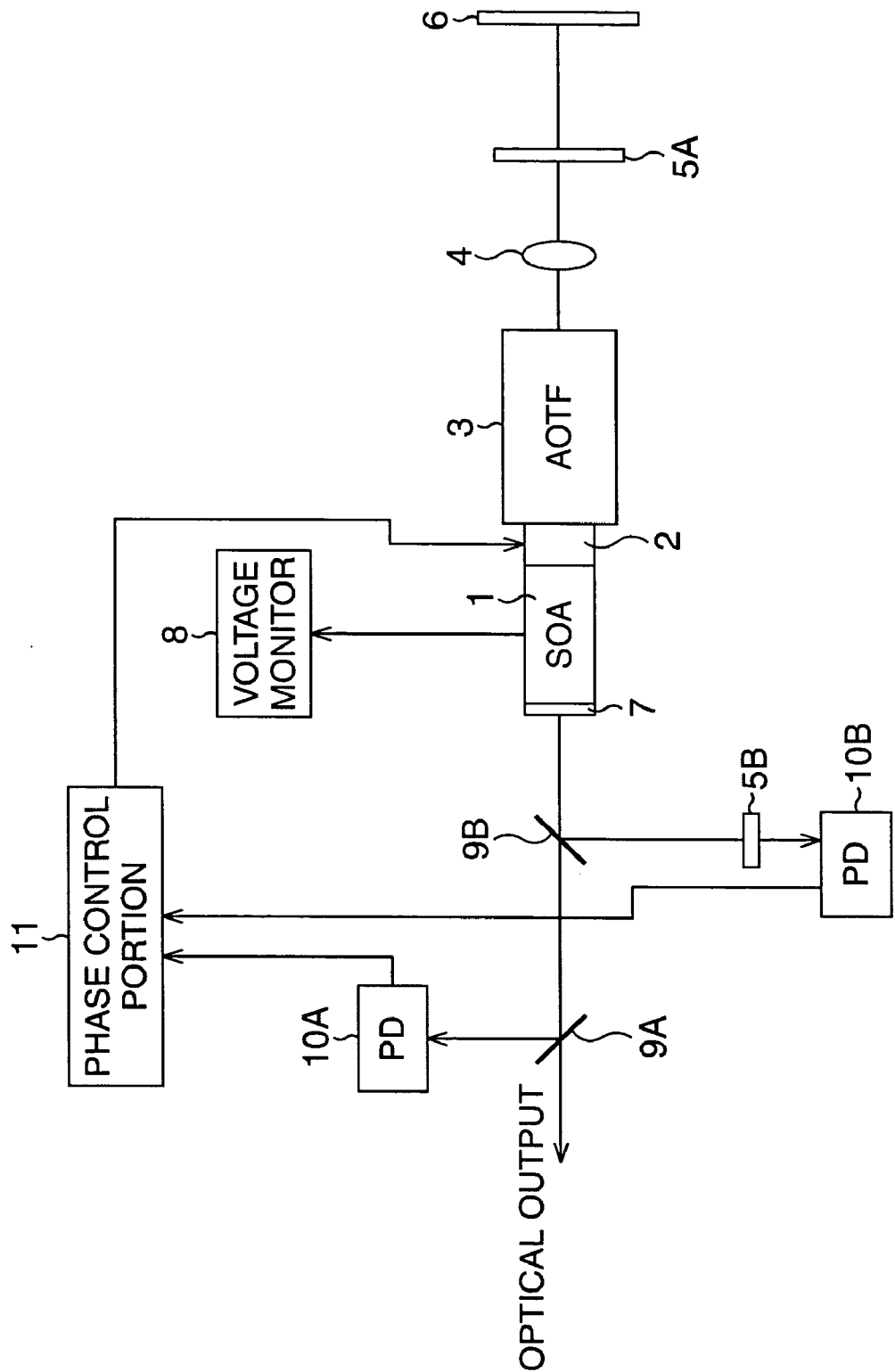
FIG. 1 is a schematic diagram showing a structure of a wavelength tunable laser according to a first embodiment of the present invention.

First, a first embodiment of the present invention will be described. FIG. 1 is a schematic diagram showing a structure of a wavelength tunable laser according to the first embodiment of the present invention.

In this embodiment, a semitransmissive reflective film 7 is formed at one end of a semiconductor optical amplifier (SOA) 1, and a reflector (a mirror of total reflection) 6 is arranged apart from the semiconductor optical amplifier 1 so as to sandwich the semiconductor optical amplifier 1 between the reflection film 7 and itself. The reflector 6 and the reflection film 7 compose a resonator. On the reflector 6 side of the semiconductor optical amplifier 1, a phase shifter 2 is provided. The phase shifter 2 is composed of integrated waveguides for controlling phase of a laser beam, for example, in the semiconductor optical amplifier 1, such a phase control is performed, for example, by current injection to the waveguide to change a refractive index. On the end surface of the reflector 6 side, a nonreflective film (not shown) is formed, whereby an acousto-optic tunable filter (AOTF) 3 is coupled with the semiconductor optical amplifier 1 via the phase shifter 2 and the nonreflective film by a butt joint technique.

Between the acousto-optic tunable filter 3 and the reflector 6, a lens 4 and an etalon 5A are arranged sequentially from the acousto-optic tunable filter 3 side. The lens 4 collimates the beam emitted from the acousto-optic tunable filter 3. The FSR (free spectrum range) of the etalon 5A is for example 50 GHz.

In the outside portion of the resonator, beam splitters 9B, 9A are arranged sequentially from the reflection film 7 side such that the reflection film 7 is sandwiched between the reflector 6 and them. The beam splitter 9B splits, for example, a tenth of the outputted laser beam which has passed through the reflection film 7. At the destination of the split beam, an optical detector (PD) 10B is arranged. Between the beam splitter 9B and the optical detector 10B, an etalon 5B is arranged. The FSR of the etalon 5B is, for example, 100 GHz. The beam splitter 9A splits part of the laser beam passing through the beam splitter 9B. At the destination of the split beam, an optical detector (PD) 10A is arranged.

Further, in this embodiment, there is provided a phase control portion 11 for controlling phase of the laser beam resonating in the resonator by adjusting the phase condition based on the detection results of the optical detectors 10A and 10B. The phase control portion 11 adjusts the phase condition by feedback control so that the ratio of the intensity detected by the optical detector 10B to the intensity detected by the optical detector 10A comes to a predetermined reference value.

Figure 7:
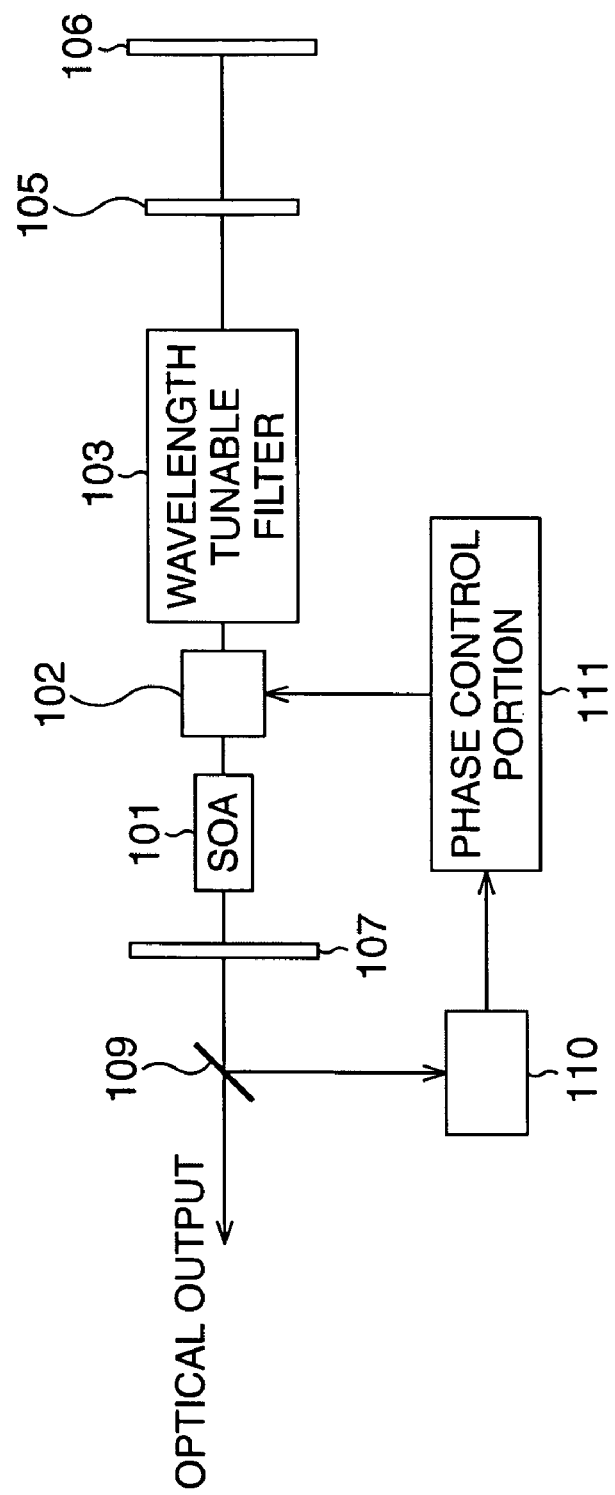
FIG. 7 is a schematic diagram showing a structure of a conventional wavelength tunable laser.
Figure 8:
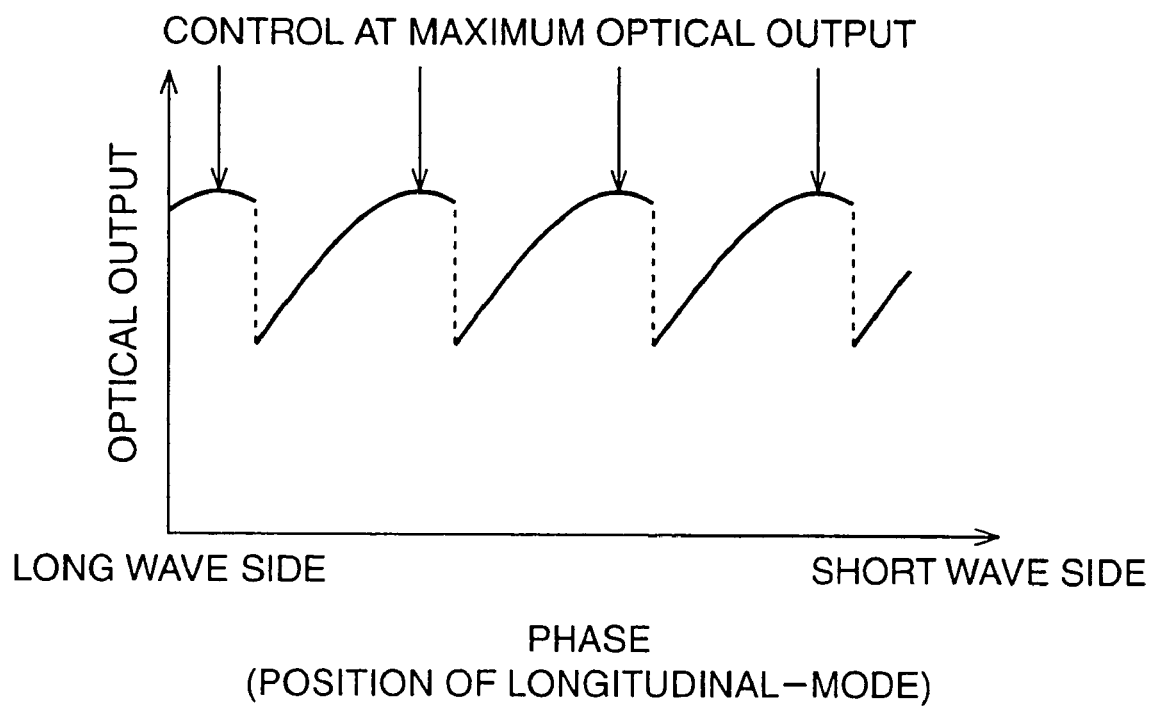
FIG. 8 is a diagram showing an optical output change when changing phase and a conventional method of controlling phase.

The conventional wavelength tunable laser shown in FIG. 7 obtains no other information about the oscillation wavelength except a maximum value from the intensity of the laser beam, so that it is possible only to fix the longitudinal mode position of the resonator to the transmissive peak wavelength of the optical filter (etalon 105) having a periodical transmissive wavelength. In contrast, the present embodiment perform controls based not only on the maximum value of the laser beam intensity but also on relative comparison of the intensities of two kinds, which is only depended on the oscillation wavelength, so that it is possible to optionally control phase (longitudinal-mode position of the resonator) in addition to the control of coinciding the longitudinal position of the resonator with the transmissive peak wavelength of the etalon 105. Therefore, it is possible to fix an oscillation wavelength to the center of a range in which oscillation of a single longitudinal mode is performed, on condition that the reference value is appropriately set.

Additionally, in this embodiment, there is provided a voltage monitor 8 for monitoring the voltage of an active layer of the semiconductor optical amplifier 1. With a feedback control such that the voltage of the active layer of the semiconductor optical amplifier 1 comes to the minimum, the acousto-optic tunable filter 3 is controlled. Incidentally, the acousto-optic tunable filter 3 may be controlled without using the voltage monitor 8, but by maximizing the intensity (optical output) detected by the optical detector 10A.

Figure 2A:
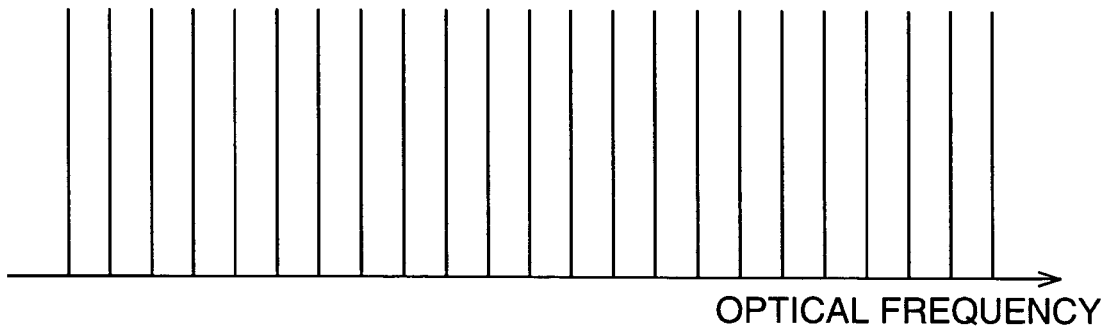
FIG. 2A to FIG. 2C are spectral maps showing filtering results using an acousto-optic tunable filter 3 and an etalon 5A.
Figure 2B:
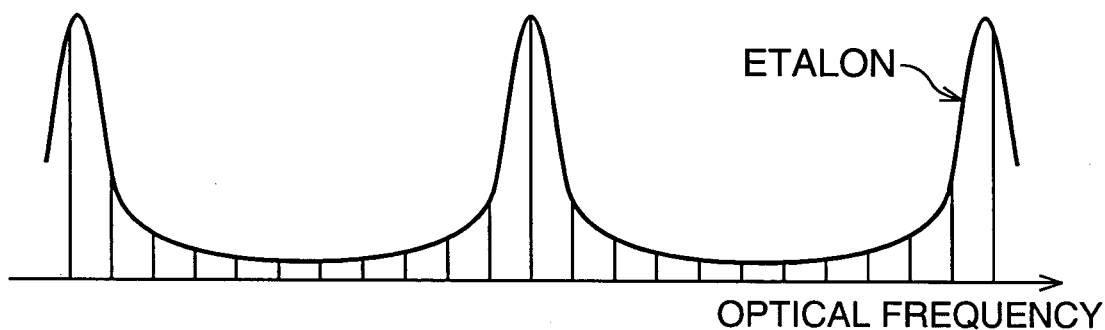
Figure 2C:
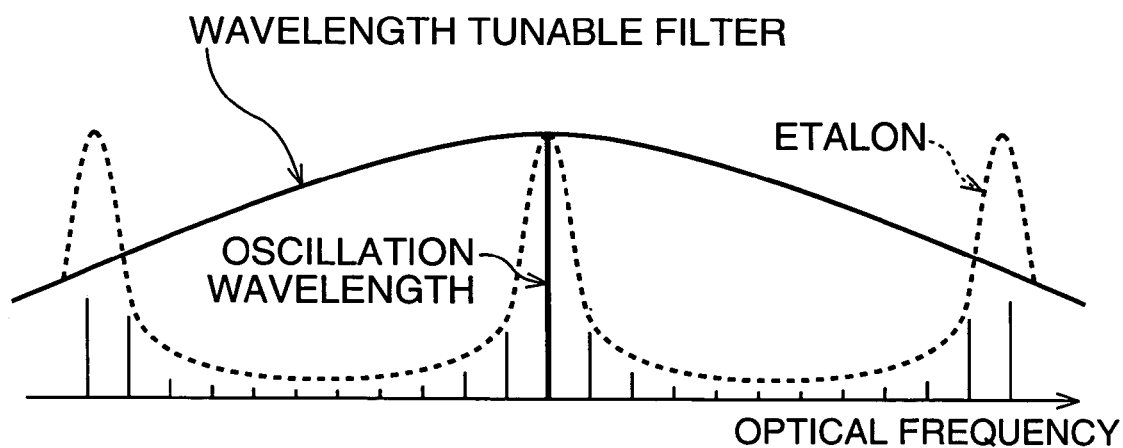

Here, operations of the acousto-optic tunable filter 3 and the etalon 5A will be described. FIG. 2A to FIG. 2C show the filtering results using the acousto-optic tunable filter 3 and the etalon 5A. In the case of the wavelength tunable laser of the above-described structure but provided with no acousto-optic tunable filter 3 and etalon 5A, every wavelengths coinciding with the longitudinal mode of the resonator have potential oscillation, as shown in FIG. 2A. When a filtering using the etalon 5A is performed with regard to the spectral shown in FIG. 2A, the oscillation is allowed only on such a wavelength of longitudinal-mode that is in the vicinity of the periodical transmissive wavelength of the etalon 5A as shown in FIG. 2B, since the etalon 5A has the periodical transmissive wavelength. Further, when a filtering using the acousto-optic tunable filter 3 is performed, of the periodical transmissive wavelengths of the etalon 5A, one wavelength is selected, allowing the oscillation on a given transmissive wavelength of the etalon 5A, as shown in FIG. 2C.

Accordingly, when filtering properties (finesse) of the etalon 5A are narrowed down, oscillation of a single longitudinal-mode is possible, where all the properties that required for the acousto-optic tunable filter 3 are only those to select one wavelength from the periodical transmissive wavelengths of the etalon 5A. This means that the requirements for the properties of the acousto-optic tunable filter 3 are reduced as compared to the case provided only with the acousto-optic tunable filter 3.

Figure 3:
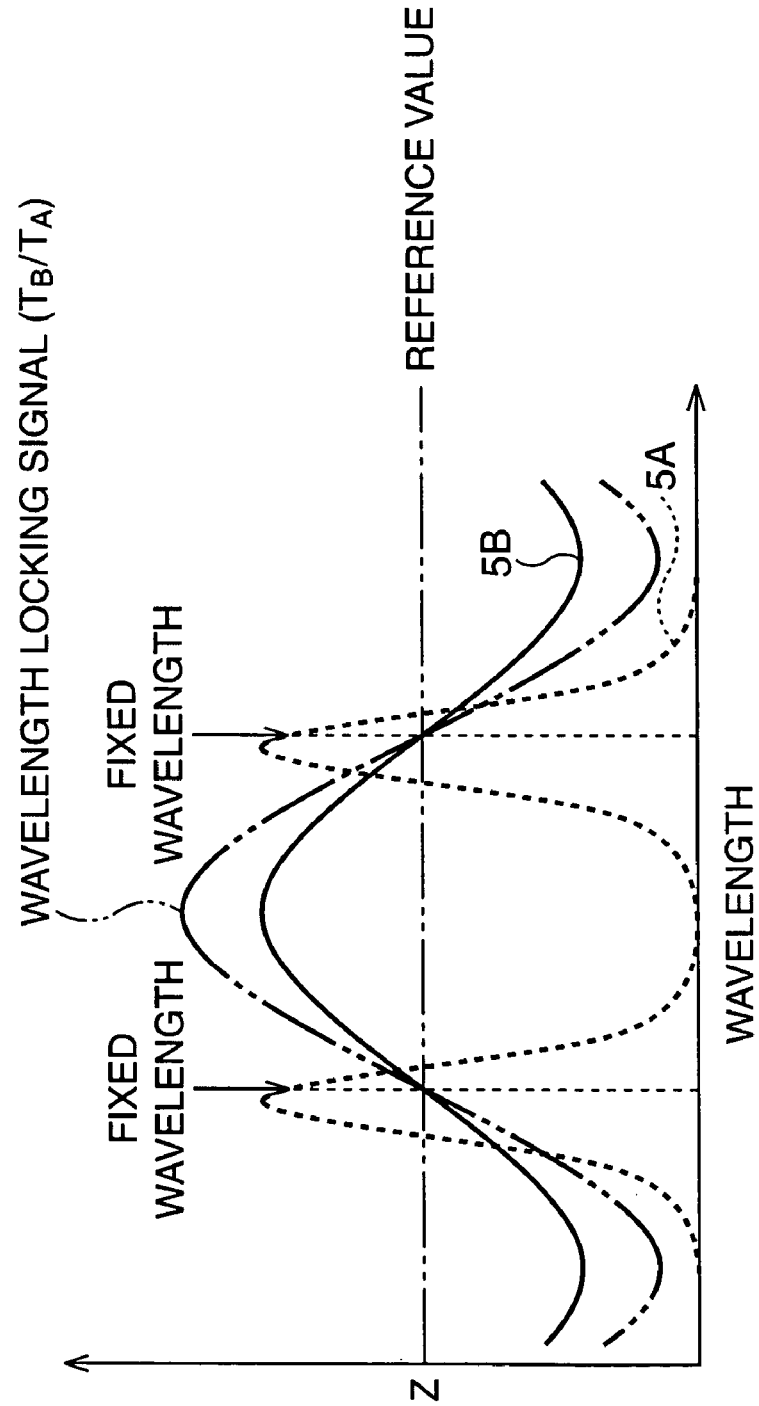
FIG. 3 is a diagram showing an intensity ratio ($T_B/T_A$) together with filter transmissibility of etalons 5A, 5B (in the case where transmissive wavelengths have different cycles)

Next, the relation between the etalon 5A and etalon 5B will be described. FIG. 3 is a diagram showing filter transmissibility of the etalons 5A, 5B. Note that the change in intensity of the laser beam emitted from the end surface of the reflection film 7 side of the semiconductor optical amplifier 1 with regard to the oscillation wavelength indicates the same tendency as of the transmissibility of the etalon 5A with regard to the wavelength in FIG. 3. Specifically, if oscillation is performed when the oscillation wavelength is in the vicinity of the peak transmissive wavelength of the etalon 5A, the laser beam intensity is high and the intensity falls in accordance with the deviation of the oscillation wavelength therefrom.

As previously mentioned, the phase control portion 11 adjusts, by the feedback control, phase condition so that the ratio ($T_B/T_A$) of the intensity ($T_B$) detected by the optical detector 10B to the intensity ($T_A$) detected by the optical detector 10A comes to a predetermined reference value (Z). The intensity ratio ($T_B/T_A$) is proportional to the transmissibility of the etalon 5B shown in FIG. 3, hence, once the oscillation wavelength is determined, the intensity ratio ($T_B/T_A$) is identified in accordance with the transmissibility of the etalon 5B on the wavelength. Conversely, therefore, a control making the intensity ratio to be a certain reference value (Z) enables to fix the wavelength. This is based on the same principle as of a common wavelength locker using etalon (see Patent document 4, Patent document 5, Patent document 6).

In this embodiment, the free spectrum range (FSR) of the etalons 5A, 5B are 50 $GH_z$ and 100 $GH_z$, respectively. This means that the FSR of the etalon 5B is a double of that of the etalon 5A. With the use of both the slopes at the right side (long wave side) and the left side (short wave side) viewing from the transmissive peak of the etalon 5B, as shown in FIG. 3, it is possible to fix the wavelength over every transmissive wavelengths at 50 GHz intervals of the etalon 5A, by adjusting the intensity ratio ($T_B/T_A$) to be a certain reference value (Z). In regard to the relation between the wavelengths of the etalons 5A, 5B, as shown in FIG. 3, at the center of the wavelength in which the transmissibility of the etalon 5A with 50 GHz intervals comes to extreme high, positioned is the wavelength in which the transmissibility of the etalon 5B comes to be extremely high. Therefore, in the vicinity of the wavelength (the oscillation wavelength of the laser) in which the transmissibility of the etalon 5A comes to extreme high, the slope of change in the transmissibility of the etalon 5B, namely the slope of change in signals for locking wavelength (intensity ratio of $T_B/T_A$) is maximized, so that the wavelength can be locked with high accuracy.

Further, in the present embodiment, the wavelength is locked with the use of both the right and left side slops of the etalon 5B, the slope of change of the locking signal (intensity ratio of $T_B/T_A$) to a wavelength is reversed from positive-negative viewpoint with regard to adjacent transmissive wavelengths of the etalon 5A, whose interval is 50 GHz. Accordingly, by detecting this slope of change, it is possible to assess the oscillation is performed either at the desired transmissive wavelength of etalon 5A or at the wavelength deviating by 50 GHz therefrom, so that a accurate wavelength control is allowed.

Figure 4:
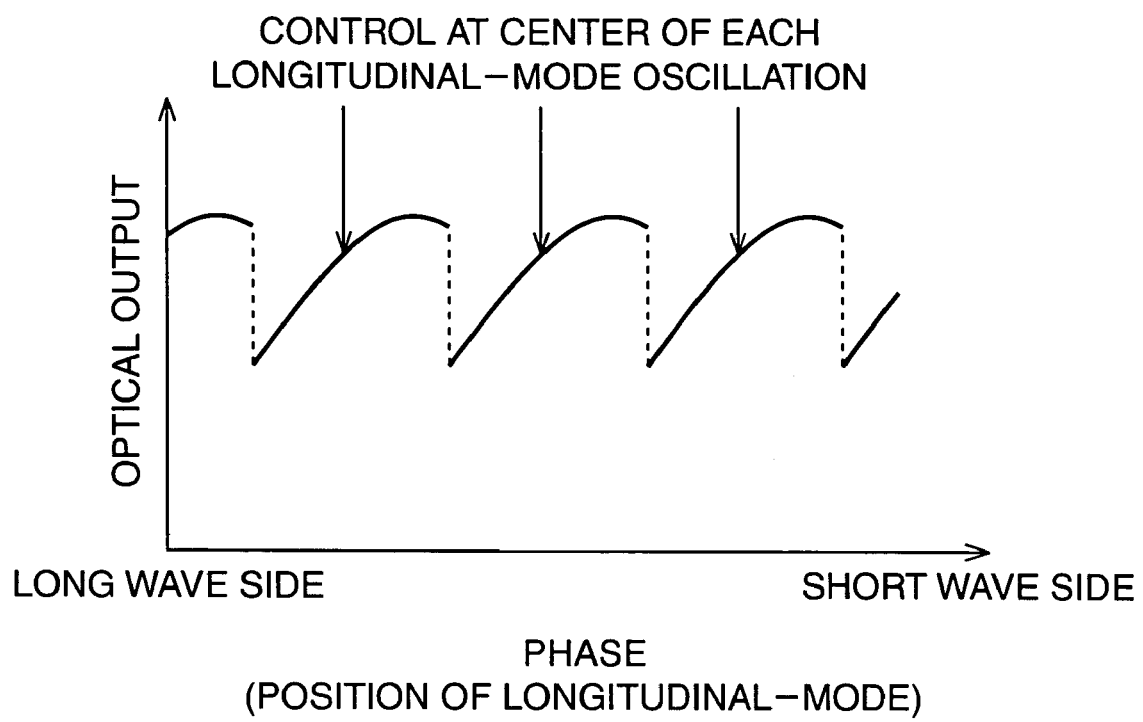
FIG. 4 is a diagram showing an optical output changes when changing phase and a method of controlling phase according to the first embodiment.

Subsequently, description will be provided for the reference value Z. As shown in FIG. 4, also in the semiconductor optical amplifier 1, the phase in which optical output (intensity of laser beam) is maximized deviates from the center of each range in which oscillation is performed in a single longitudinal mode, due to the influence of the asymmetric gain saturation. For such properties of the semiconductor optical amplifier 1, in this embodiment, before performing the above-mentioned phase control based on the intensity ratio ($T_B/T_A$), a graph is made such as shown in FIG. 4, and such a value is obtained as of the oscillation wavelength corresponding to the phase of the center of each range in which oscillation is performed in a single mode. Then, the intensity ratio ($T_B/T_A$) at the time when the oscillation wavelength has the value is obtained to define it as a reference value Z.

In this manner, the control of the longitudinal-mode position of the resonator (control of resonator length) is achieved by making the intensity ratio ($T_B/T_A$) coincide with a predetermined reference value Z.

Consequently, no dithering is required for phase control, so that unnecessary wavelength fluctuation is prevented.

Further, for controlling the acousto-optic tunable filter 3 (selection of filter), as an example, a feedback control such that the voltage of the active layer of the semiconductor optical amplifier 1 detected by the voltage monitor 8 is minimized, or a feedback control such that the intensity (optical output) detected by the optical detector 10A is maximized may be acceptable. Simply, the control of the acousto-optic tunable filter 3 can be performed independently from the phase control. For reference, favorably, the control of the longitudinal-mode position of the resonator is performed more frequently than the control of the acousto-optic tunable filter 3.

Second Embodiment

Figure 5:
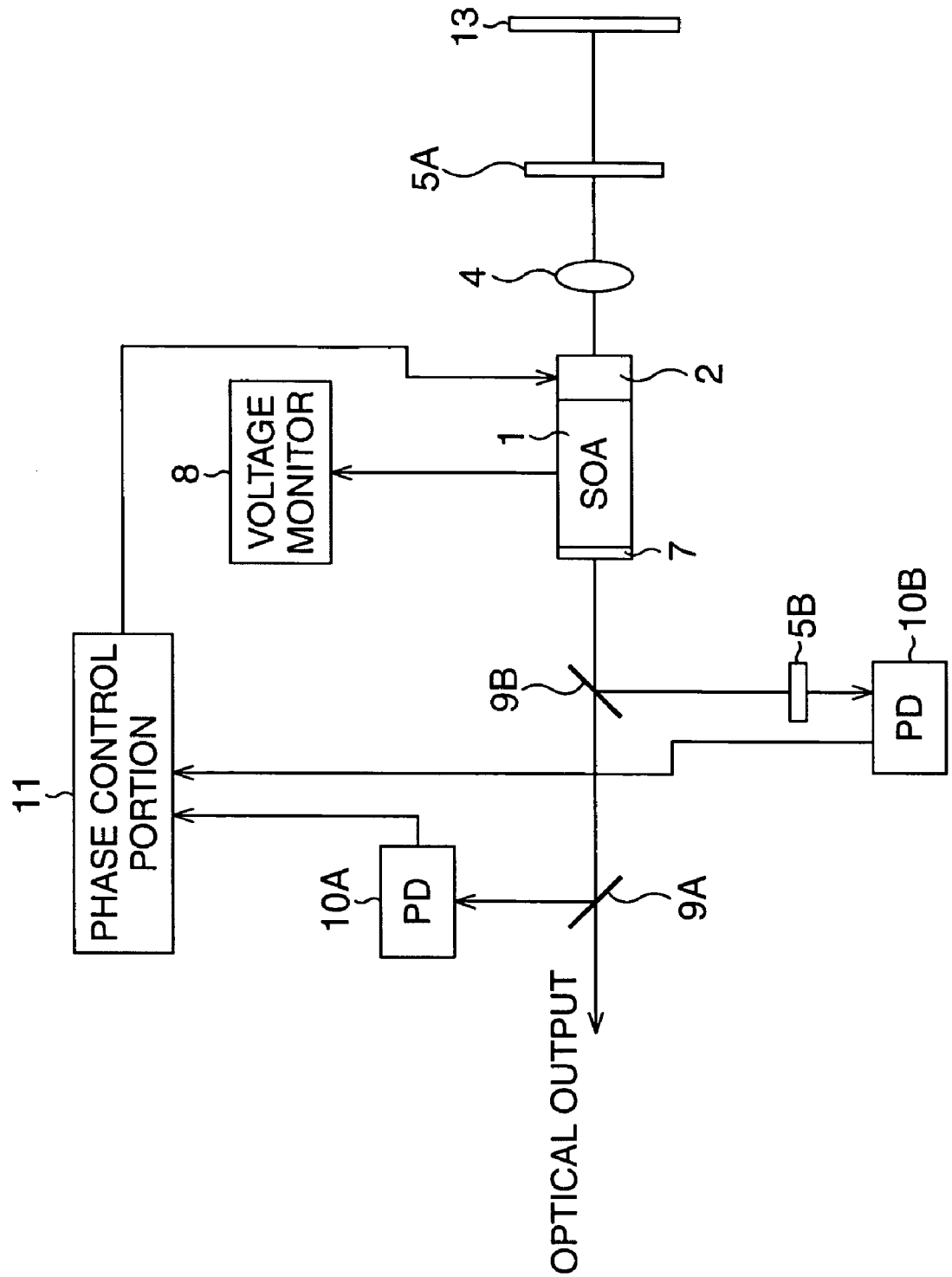
FIG. 5 is a schematic diagram showing a structure of a wavelength tunable laser according to a second embodiment of the present invention.

Subsequently, a second embodiment of the present invention will be described. FIG. 5 is a schematic diagram showing a structure of the wavelength tunable laser according to the second embodiment of the present invention.

In this embodiment, there is provided a reflection-type wavelength tunable filter 13 instead of an acousto-optic tunable filter 3 of the first embodiment. No reflector 6 is provided. The reflection-type wavelength tunable filter 13 is provided not between a phase shifter 2 and a lens 4, but in the position where the reflector 6 is provided in the case of the first embodiment. Therefore, in this embodiment, a resonator is composed of a reflection film 7 and the reflection-type wavelength tunable filter 13. The reflection-type wavelength tunable filter 13 reflects only a desired beam and is a wavelength tunable filter for filtering out the beam on the other wavelength, the reflection-type wavelength tunable filter 13 being for example a reflection-type filter making use of a diffraction grating. Such a wavelength tunable filter is outlined, for example, in Non-Patent document 1.

Also, in the wavelength tunable laser according to the second embodiment of such a structure, the same effect as of the first embodiment can be obtained.

Figure 6:
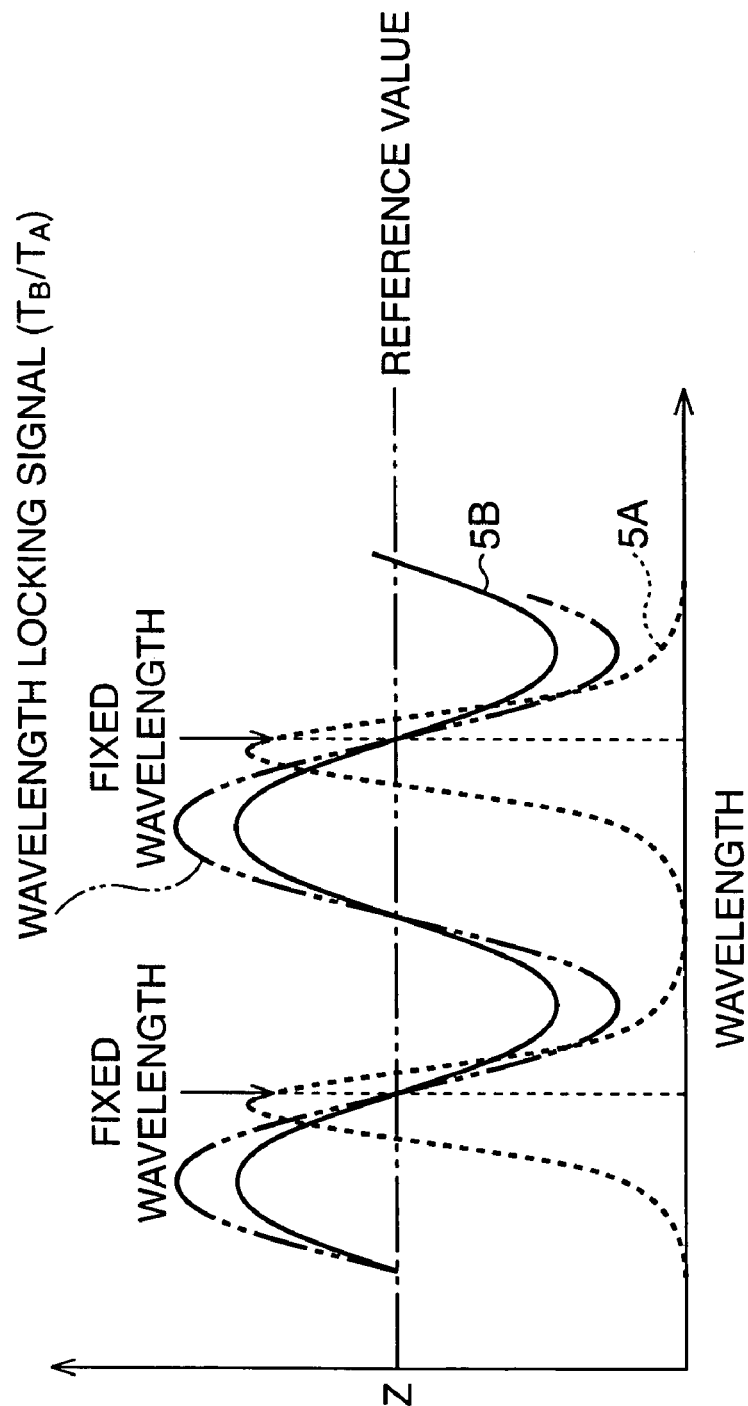
FIG. 6 is a diagram showing the intensity ratio ($T_B/T_A$) together with filter transmissibility of etalons 5A, 5B (in the case where the free spectrum range ("FSR") is the same for each)

It should be noted that, in the first and second embodiments, the free spectrum range of an etalon 5B is a double of that of an etalon 5A, whereas, they can be the same. When they are the same, as shown in FIG. 6, without regard to the wavelength in which the transmissibilities of the etalon 5A and the etalon 5B are maximized, a reference value (Z) can be made constant over every transmissive peak wavelengths of the etalon 5A, whereby allowed a simple control. Incidentally, when the laser beam outputted from the semiconductor optical amplifier 1 has no intensity fluctuation, the change in the transmissibility of the filter with regard to the wavelength shown in FIG. 6 coincides with the change in the intensity of the laser beam outputted from the resonator.

Further, when FSRs are the same each other, the wavelengths on which their filter transmissibilities are extreme high favorably deviate from each other on the order of T/4, where T is FSR of etalon 5B. This is for locking the wavelength with high accuracy, in the vicinity of the wavelength on which the transmissibility of the etalon 5A is maximized, namely in the vicinity of the oscillation wavelength of the laser, by maximizing the slope (slope of change in the wavelength locking signals (intensity ratio $(T_B/T_A)$)) of the transmissibility of the etalon 5B with regard to the wavelength.

Third Embodiment

Figure 9:
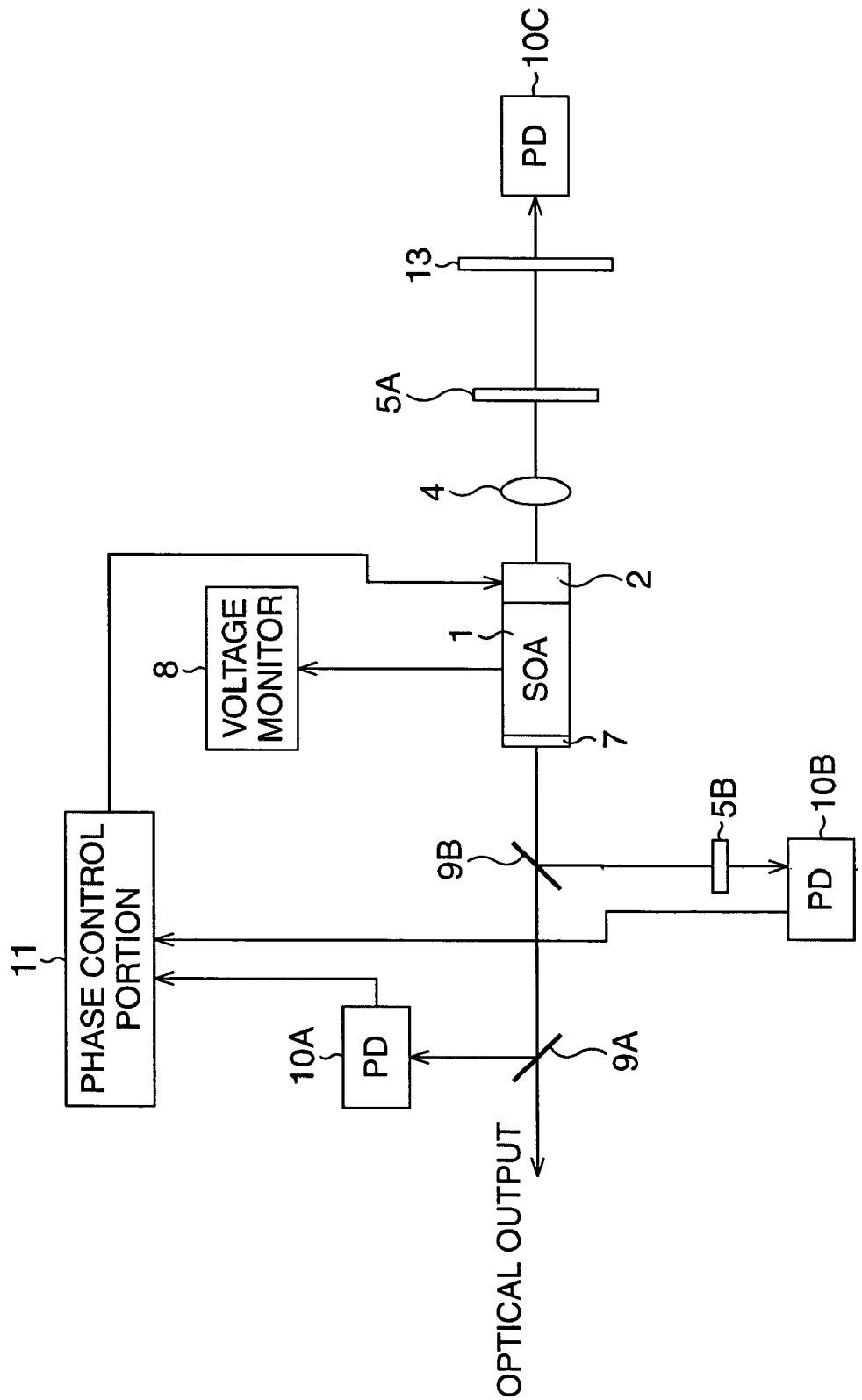
FIG. 9 is a schematic diagram showing a structure of a wavelength tunable laser according to a third embodiment of the present invention.

Subsequently, a third embodiment of the present invention will be described. FIG. 9 is a schematic diagram showing a structure of a wavelength tunable laser according to the third embodiment of the present invention.

In this embodiment, in addition to the structure of the second embodiment, there is provided an optical detector 10C for detecting the intensity of the beam passing through a reflection-type wavelength tunable filter 13. In this embodiment, a phase control is performed in the same manner as in the first and second embodiments. While, a filter wavelength control in the reflection-type wavelength tunable filter 13 is performed so that the ratio of an optical intensity $(T_A)$ detected by the optical detector 10A to an optical intensity $(T_C)$ detected by the optical detector 10C comes to a given value, differently from the first and second embodiments. The optical intensity of the beam passing through and comes from the reflection-type wavelength tunable filter 13, which is detected by the optical detector 10C, is the minimum when the filter wavelength coincides with an oscillation wavelength, and the more they deviate, the larger the optical intensity becomes. This tendency is inverse of the change in the optical output of the laser detected by the optical detector 10A. Therefore, if the ratios of these are monitored, the change with regard to the wavelength is further distinguished than in the case where only an intensity of the laser beam is monitored, allowing the control of the filter wavelength of the reflection-type wavelength tunable filter 13, with high accuracy. In addition, the monitoring of the ratio makes it possible to omit the fluctuation of the optical output of the laser itself, so that stable control is enabled.

Fourth Embodiment

Figure 10:
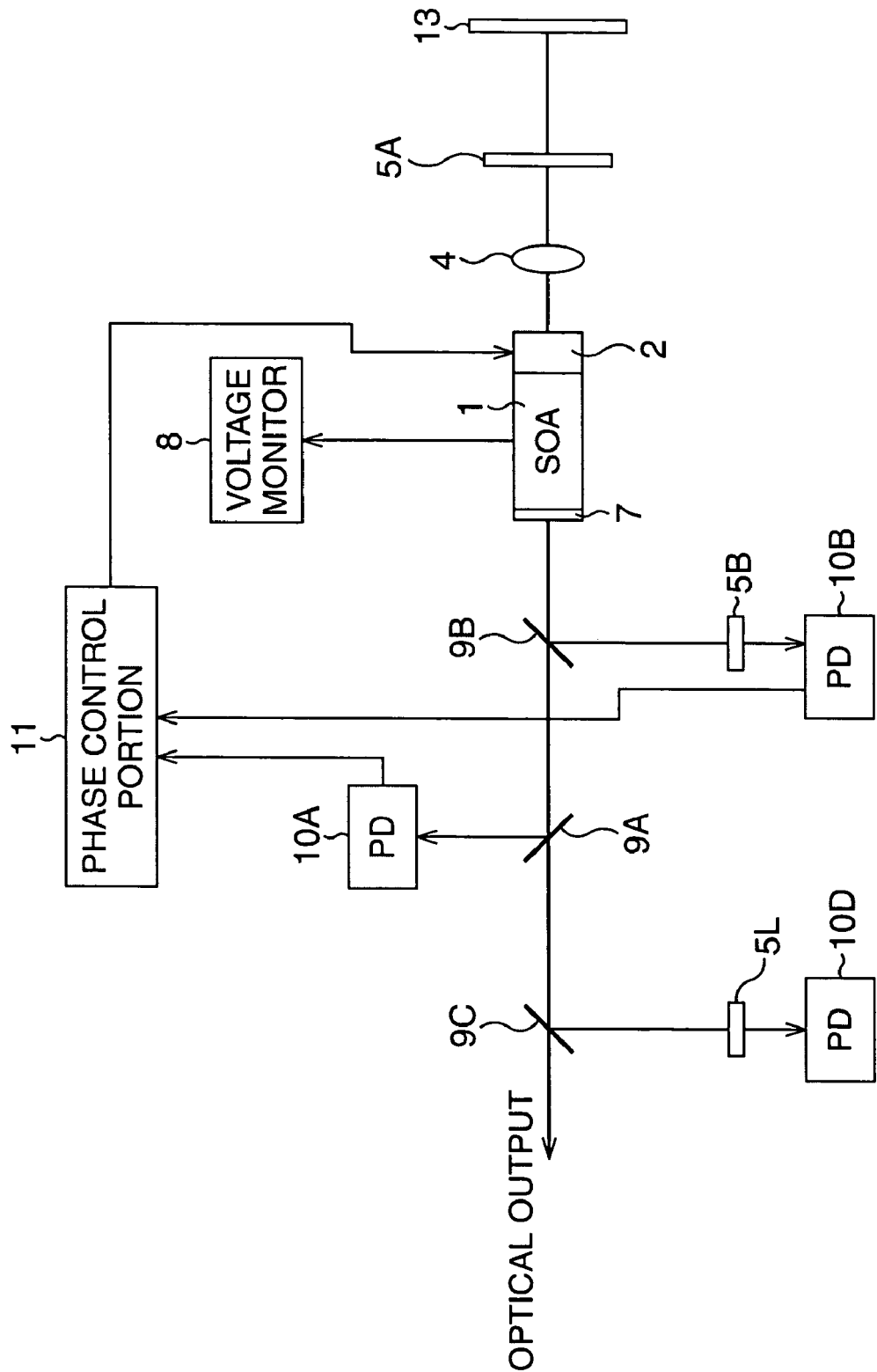
FIG. 10 is a schematic diagram showing a structure of a wavelength tunable laser according to a fourth embodiment of the present invention.

Subsequently, a fourth embodiment of the present invention will be described. FIG. 10 is a schematic diagram showing a structure of a wavelength tunable laser according to the fourth embodiment of the present invention.

In this embodiment, in addition to the structure of the second embodiment, there are provided a beam splitter 9C at rearward of the beam splitter 9A, an optical detector 10D at the destination of the split beam of the beam splitter 9C, and a linear filter 5L between the beam splitter 9C and the optical detector 10D. The linear filter 5L is composed of a medium of which transmissibility changes modestly and monotonically with regard to a wavelength. In this embodiment, intensity of an incident beam on the optical detector 10D changes in accordance with dependency of the transmissibility of the linear filter 5L on the wavelength. Therefore, with an optical intensity value detected by the optical detector 10D, it is possible to identify a oscillation wavelength by assessing approximate transmissibility wavelength of the etalon 5A corresponding to the oscillation wavelength. Based on this, it is possible to accurately assess whether or not the current oscillation wavelength is a desired one, so that stable wavelength control is allowed. Not only the second embodiment, but also the first and third embodiments may adapt such a structure of the fourth embodiment.

Incidentally, in the first to fourth embodiments, as a wavelength tunable filter, an acousto-optic tunable filter 3 and a reflection-type wavelength tunable filter 13 utilizing a diffraction grating are employed, whereas, a wavelength tunable filter of the other kinds may be used. Additionally, layout of respective elements and the like shall not be limited to the above description of the embodiments.

Further, a unit to split light is not limited to the beam splitter. Other unit is applicable if it has a function to split light.

According to the present invention, phase control is performed based on the ratio of the intensities detected by the first and second optical detectors, whereby allowed a stable phase control, in which the oscillation wavelength can be controlled easily and appropriately, so that favorable noise characteristics can be obtained.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A wavelength tunable laser comprising:
   a semiconductor optical amplifier for emitting a laser beam;
   a wavelength tunable filter arranged in an optical path of the laser beam;
   a first optical filter arranged in the optical path of the laser beam and provided with a periodical transmissive wavelength;
   two reflective members arranged so as to sandwich said semiconductor optical amplifier, said wavelength tunable filter, and said first optical filter, therebetween, said two reflective members being for resonating said laser beam;
   a phase shifter for controlling a phase of the laser beam resonating between said reflective members;
   a first unit to split light and a second unit to split light for splitting part of the laser beam passing through one of said reflective members;
   a first optical detector for detecting an intensity of the laser beam split by said first unit to split light;
   a second optical filter arranged in the optical path of the laser beam split by said second unit to split light and provided with a periodical transmissive wavelength; and
   a second optical detector for detecting the intensity of the laser beam passing through said second optical filter,
   wherein said phase shifter controls phase of the laser beam so that a ratio of the intensity detected by said second optical detector to the intensity detected by said first optical detector comes to a certain value.

2. The wavelength tunable laser according to claim 1, wherein, of said two reflective members, one arranged at a side apart from said first and second units to split light and said wavelength tunable filter are composed of a same member.

3. The wavelength tunable laser according to claim 2, wherein said member is a reflection-type filter using a diffraction grating.

4. The wavelength tunable laser according to claim 1, wherein a free spectrum range of said first optical filter and a free spectrum range of said second optical filter coincide with each other.

5. The wavelength tunable laser according to claim 1, wherein a free spectrum range of said second optical filter is a double of a free spectrum range of said first optical filter.

6. The wavelength tunable laser according to claim 1, wherein said wavelength tunable filter is controlled so that the intensity of the laser beam detected by said first optical detector is maximized.

7. The wavelength tunable laser according to claim 1, wherein said wavelength tunable filter is controlled so that a voltage applied to said semiconductor optical amplifier is minimized.

8. The wavelength tunable laser according to claim 3, further comprising a third optical detector for detecting the intensity of the beam passing through said reflection-type filter,
   wherein a filter wavelength of said reflection-type filter is controlled so that the ratio of the optical intensity detected by said first optical detector to the optical intensity detected by the third optical detector comes to a given value.

9. The wavelength tunable laser according to claim 1, further comprising:
   a third unit to split light for splitting part of the laser beam passing through one of said two reflective members;
   a medium arranged in the optical path of the laser beam split by said third unit to split light, of which transmissibility changes modestly and monotonically with regard to a wavelength; and
   a third optical detector for detecting the intensity of the laser beam passing through said medium,
   wherein an oscillation wavelength is identified based on the optical intensity detected by said third optical detector.

10. The wavelength tunable laser according to claim 1, wherein a value calculated based in advance on a relation between phase of the laser beam resonating between said two reflective members and the intensity of the laser beam passing through one of said two reflective members is used as the certain value.

11. The wavelength tunable laser according to claim 1, wherein said wavelength tunable laser has a phase range in which resonation in a same longitudinal mode is allowed, and
    wherein the ratio of the intensity detected by said second optical detector to the intensity detected by said first optical detector when a center phase of the phase range is obtainable is used as the certain value.

12. The wavelength tunable laser according to claim 1, wherein said first and second optical filters are etalons.

13. A method of controlling a wavelength tunable laser, said wavelength tunable laser including: a semiconductor optical amplifier for emitting a laser beam; a wavelength tunable filter arranged in an optical path of the laser beam; a first optical filter arranged in the optical path of the laser beam and provided with a periodical transmissive wavelength; two reflective members arranged so as to sandwich the semiconductor optical amplifier, the wavelength tunable filter, and the first optical filter, therebetween, the two reflective members being for resonating the laser beam; a phase shifter for controlling a phase of the laser beam resonating between the reflective members; a first unit to split light and a second unit to split light for splitting part of the laser beam passing through one of the reflective members; a first optical detector for detecting an intensity of the laser beam split by the first unit to split light; a second optical filter arranged in the optical path of the laser beam split by the second unit to split light and provided with a periodical transmissive wavelength; and a second optical detector for detecting the intensity of the laser beam passing through the second optical filter,
    the method of controlling the wavelength tunable laser comprising the step of:
    controlling phase of the laser beam resonating between the two reflective members so that a ratio of the intensity detected by the second optical detector to the intensity detected by the first optical detector comes to a certain value.

14. The method of controlling the wavelength tunable laser according to claim 13, wherein the wavelength tunable filter is controlled so that the intensity detected by the first optical detector is maximized.

15. The method of controlling the wavelength tunable laser according to claim 13, wherein the wavelength tunable filter is controlled so that a voltage applied to the semiconductor optical amplifier is minimized.

16. The method of controlling the wavelength tunable laser according to claim 13,
wherein a value calculated in advance based on a relation between phase of the laser beam resonating between the two reflective members and the intensity of the laser beam passing through one of the two reflective members is used as the certain value.

17. The method of controlling the wavelength tunable laser according to claim 13,
wherein the wavelength tunable laser has a phase range in which resonation in a same longitudinal mode is allowed between the two reflective members, and
wherein the ratio of an intensity detected by the second optical detector to the intensity detected by the first optical detector when a central phase of the phase range is obtainable is used as the certain value.

* * * * *